United States Patent [19]
Thakur et al.

[11] Patent Number: 5,646,075
[45] Date of Patent: *Jul. 8, 1997

[54] METHOD FOR OPTIMIZING THERMAL BUDGETS IN FABRICATING SEMICONDUCTORS

[75] Inventors: Randhir P. S. Thakur; Fernando Gonzalez, both of Boise, Id.

[73] Assignee: Micron Technology, Inc., Boise, Id.

[*] Notice: The term of this patent shall not extend beyond the expiration date of Pat. No. 5,428,164.

[21] Appl. No.: 559,511

[22] Filed: Nov. 15, 1995

Related U.S. Application Data

[63] Continuation of Ser. No. 427,941, Apr. 25, 1995, Pat. No. 5,474,955, which is a continuation-in-part of Ser. No. 102, 908, Aug. 6, 1993, Pat. No. 5,409,858.

[51] Int. Cl.$^6$ ........................ H01L 21/324; H01L 21/477
[52] U.S. Cl. .................... 437/247; 437/236; 437/228; 437/982; 148/DIG. 133
[58] Field of Search .................. 437/247, 48, 52, 437/235, 236, 228, 982; 148/DIG. 33

[56] References Cited

U.S. PATENT DOCUMENTS

| | | | |
|---|---|---|---|
| 4,630,343 | 12/1986 | Pierre | 437/982 |
| 5,354,387 | 10/1994 | Lee et al. | 437/235 |
| 5,409,858 | 4/1995 | Thakur et al. | 437/173 |

FOREIGN PATENT DOCUMENTS

| | | | |
|---|---|---|---|
| 0540321 | 5/1993 | European Pat. Off. | 437/235 |
| 3425531 | 1/1986 | Germany | 148/DIG. 133 |
| 14444 | 1/1987 | Japan | 148/DIG. 133 |

OTHER PUBLICATIONS

Wolf et al., vol. I, Silicon Processing for the VLSI Era, Lattice Press, 1986.

Wolf et al., vol. II, Silicon Processing for the VLSI Era, Lattice Press, 1990.

"Improvement of Dielectric Integrity of TiSi$_x$—Polycide-gate System by Using Rapidly Nitrided Oxides" by T. Hori, N. Yoshi, & H. Iwasaki, pp. 2571–2574, 1988 Fluorinated Silicon Nitride Films.

"Reduced Thermal Budget Borophosphosilicate Glass (BPSG) Fusion and Implant Activation Using Roped Thermal Annealing and Steam Reflow", R. Thorkur et al. Materials Research Society Mar. 1993.

*Primary Examiner*—Tuan H. Nguyen

[57] ABSTRACT

The present invention teaches a method for fabricating semiconductors. The method initially comprises the step of forming a conformal layer superjacent at least two conductive layers. The conformal layer preferably comprises tetraethylorthosilicate ("TEOS") and has a thickness of at least 50 Å. Subsequently, a barrier layer is formed superjacent the conformal layer to prevent subsequent layers from diffusing into active regions. The barrier layer preferably comprises $Si_3N_4$, though other suitable materials known to one of ordinary skill in the art may be employed. Further, a glass layer is then formed superjacent the barrier layer. The glass layer comprises at least one of $SiO_2$, phosphosilicate glass, borosilicate glass, and borophosphosilicate glass, and has a thickness of at least 1 kÅ. Upon forming the glass layer, the glass layer is heated to a temperature of at least 800° C. for at least 15 minutes while introducing $H_2$ and $O_2$ at a substantially high temperature to cause vaporization, thereby causing the glass layer to reflow. Next, the glass layer is exposed to a gas and radiant energy for approximately 5 seconds to 60 seconds, thereby making said glass layer substantially planar. The radiant energy generates a temperature substantially within the range of 700° C. to 1250° C. Further, the gas comprises at least one of $N_2$, $NH_3$, $O_2$, $N_2O$, Ar, Ar—$H_2$, $H_2$, $GeH_4$, and a Fluorine based gas.

47 Claims, 6 Drawing Sheets

METHOD FOR OPTIMIZING THERMAL BUDGETS IN FABRICATING SEMICONDUCTORS

CROSS REFERENCE TO A RELATED APPLICATION

This is a continuation to U.S. patent application Ser. No. 08/427,941, filed Apr. 25, 1995, now U.S. Pat. No. 5,474,955 which is a continuation-in-part of U.S. Pat. No. 5,409,858, Ser. No. 102,908 filed Aug. 06, 1993. U.S. patent application Ser. No. 08/427,941 and U.S. Pat. No. 5,409,858 are hereby incorporated by reference as if set forth in their entirety.

FIELD OF THE INVENTION

The present invention relates to a method for fabricating semiconductors, and more particularly, a method for optimizing the deposition and reflow properties of doped and undoped glass and in particular borophosphosilicate glass ("BPSG").

BACKGROUND OF THE INVENTION

Advanced semiconductor devices, such as highly dense dynamic random access memories ("DRAMs"), impose severe restrictions on the times, temperatures and atmospheres of all thermal process steps. This particularly is the case following the source-drain implantation. Source-drain implant activation and the reflow of doped and undoped glasses, and as particular example, BPSG reflow, are two of the process steps that contribute significantly towards enhanced overall thermal budget during the fabrication of DRAM devices.

Glass films such as Borophosphosilicate glass ("BPSG") films or layers, are especially important in the step of planarizing advanced DRAM devices having increased stacked capacitor heights and integrated densities. As the formation and subsequent reflow of glass films (i.e., BPSG films) are of critical importance, efforts have been made to investigate its mechanical, electrical, and structural properties. To assure continuity of metal lines over steps at a reduced thermal budget, it is essential to obtain superior quality glass films.

Reflow properties at lower thermal budgets can be enhanced by employing a higher concentration of boron in the BPSG layer. However, merging the step of activating source-drain implants with the reflow thermal cycle step produces higher device speeds. A trade-off between the overall thermal budget required for reflow and activation and lower boron concentration can eliminate the problem of dopant out diffusion due to higher boron and phosphorus concentration, as well as provide higher activation of the source-drain regions.

For submicron device fabrication, the use of short time rapid thermal processing ("RTP") cycles at high temperatures is becoming more attractive for shallower junctions and lower diffusion of dopants. Even at short time RTP reflow cycles, it is crucial to attain good conformality by using an optimum process window to anneal out the effects of moisture, aging, and water absorption in the glass film, such as BPSG film, which may result in void formation and segregation.

SUMMARY OF THE INVENTION

The primary advantage of the present invention is to eliminate the aforementioned drawbacks of the prior art.

There remains a need to provide a process which provides better sheet resistance of source-drain regions, contact resistance, and change of channel length over the present technique obtainable using a furnace-alone thermal cycle step. Moreover, there is demand for a method that avoids a threshold voltage ($v_t$) shift which can arise due to changes in boron and phosphorus concentration in the BPSG layer. Further, a technique is required which provides an improved glass film reflow step, such as for a BPSG film reflow step, enabling greater planarity and uniformity. Additionally, there is a demand for a process which lowers junction depth, as well as limits dopant diffusion.

In order to achieve the benefits of the present invention, a method is disclosed for fabricating semiconductor wafers. The method initially comprises the step of forming a glass layer superjacent a semiconductor substrate. Once formed, the glass layer is heated while introducing $H_2$ and $O_2$ at a substantially high temperature to cause vaporization. Finally, the glass layer is exposed to a gas and radiant energy.

Other aspects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

PROCESS

Figure 1:
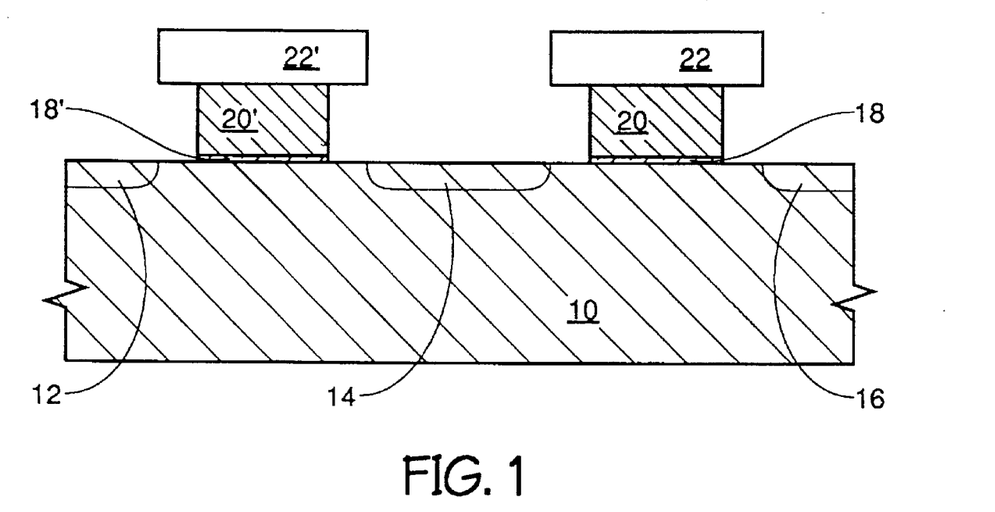
FIG. 1 is a cross-sectional perspective of a silicon substrate prior to undergoing the present invention.

Referring to FIG. 1, a cross-sectional perspective of a semiconductor substrate 10 prior to undergoing the present invention is depicted. Substrate 10 is essentially a two channel device for the purposes of the present invention. However, it should be obvious to one of ordinary skill in the art that the advantages of the present invention could be applied to other structural configurations. For example, each channel device could be replaced by a conductive layer.

Superjacent substrate 10 is a first channel device 20 and a second channel device 20'. It is desired that the aspect ratio for defining first channel device 20 and second channel device 20' (the spacing between of each device versus the pitch of the device) is at least 1:1 and it preferred that the aspect ratio be 6:1. This range of aspect ratios from 1:1 to 6:1 is intended to include all aspect ratios assumed therein. For example, the optimum spacing between first channel device 20 and second channel device 20' is 0.3 microns with a pitch of 0.6 microns. Positioned in between first and second channel devices 20 and 20' and substrate 10 are silicon dioxide layers 18 and 18'. Substrate 10 further comprises a series of implanted regions or wells 12, 14 and 16. Further, directly superjacent first and second channel devices 20 and 20' are layers 22 and 22'. Layer 22 and 22' preferably comprise a polymer resist. Nonetheless, layers 22 and 22' can also comprise polyamide, silicon dioxide, or any other material known in the art which can be patterned. It should be noted that while polymer resist layers 22 and 22' are not removed during the present inventive method, their purpose is to keep maintain the implanted regions 12, 14 and 16 by preventing lateral diffusion.

Figure 2:
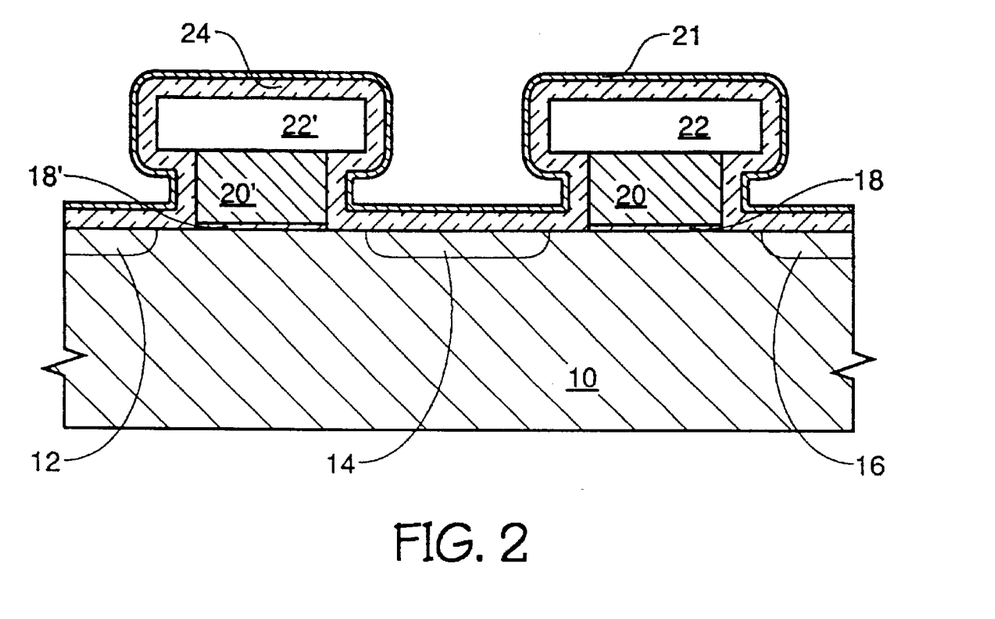
FIG. 2 is a cross-sectional perspective of a silicon substrate undergoing the first step of the present invention.

Referring to FIG. 2, a cross-sectional perspective of semiconductor substrate 10 is shown having undergone a first step of the present invention. After initially providing substrate 10, a conformal layer 24 is formed superjacent substrate 10 to uniformly conform to the topography of substrate 10. Conformal layer preferably comprises tetra-ethylorthosilicate ("TEOS") and has a thickness of at least 50 Å. It is preferred that conformal layer 24 be formed by the dissociation of TEOS and that the resulting layer 24 be subjected to a plasma treatment of $N_2$ containing species to harden the surface. However, conformal layer 24 can also comprise titanium nitride, tantalum nitride, titanium oxide, tantalum oxide, silicon dioxide or silicon nitride. Further, conformal layer 24 can be formed by a variety of techniques known to one of ordinary skill in the art, such as plasma deposition, low pressure chemical vapor deposition, molecular beam epitaxy, and rapid thermal chemical vapor deposition for example. As such, these techniques are not described herein.

In one embodiment of the present invention, a barrier layer 21 is formed superjacent conformal layer 24 and is preferably formed by rapid thermal nitridation. Barrier layer 21 is formed superjacent conformal layer 24 to prevent subsequent superjacent layers from diffusing into active regions of substrate 10. Barrier layer 21 preferably comprises $Si_3N_4$, though other suitable materials known to one of ordinary skill in the art may be employed. For example, barrier layer 21 may be formed by further oxidation of layer 24 followed by a subsequent densification using nitrous oxide, nitric oxide or other nitrogen containing species during the TEOS densification/anneal step to form layer 24.

Figure 3:
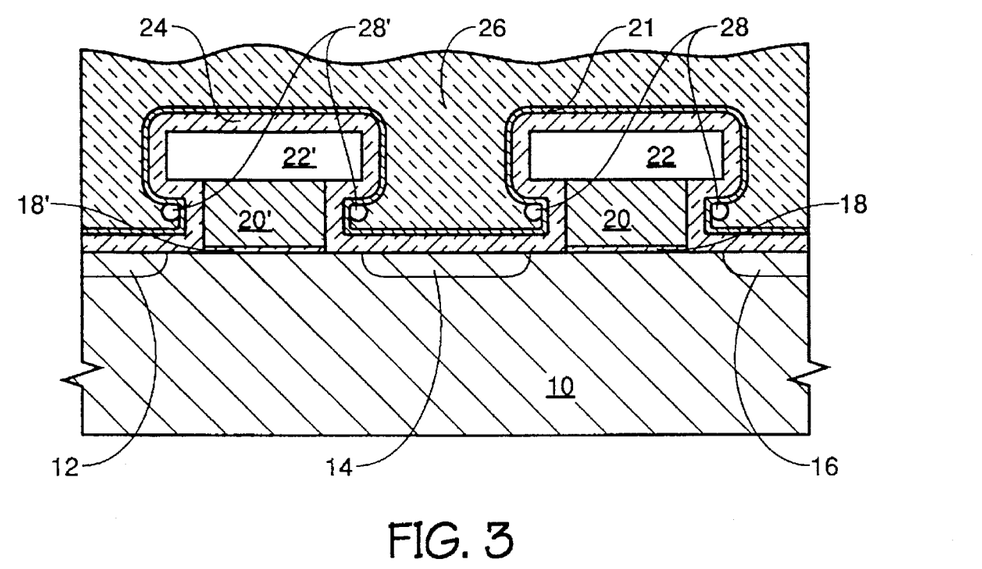
FIG. 3 is a cross-sectional perspective of a silicon substrate undergoing the second step of the present invention.

Referring to FIG. 3, a cross-sectional perspective of semiconductor substrate 10 is provided having undergone a second step of the present invention. Upon forming a conformal layer 24 superjacent substrate 10 to uniformly conform to the topography of substrate 10, a glass layer 26 is formed superjacent the new topography of substrate 10, now including conformal layer 24. Glass layer 26 may be a doped or undoped glass layer, however, preferably glass layer 26 comprises at least one of $SiO_2$, borophosphosilicate glass (BPSG), phosphosilicate glass ("PSG"), borosilicate glass ("BSG"), germanium-borophosphosilicate glass ("GeBPSG") and non-doped silicate glass ("NSG") or any combination thereof. Glass layer 26 additionally comprises a thickness of at least 1 kÅ. Further, glass layer 26 can be formed by a variety of techniques known to one of ordinary skill in the art. For example, the glass layers may be deposited by ozone-TEOS based chemistry by using organometallic sources, such as Triethylphosphate (TEPO), Triethylphosphite (TMPI), Trimethylphosphate (TMPO), Triethylborate (TEB), Trimethylborate (TMB), and Tetramethoxy germane (TMOG). One skilled in the art will recognize the various films formed by such sources using ozone-TEOS based chemistry and as such, these techniques are not described herein.

Subsequent to forming glass layer 26 superjacent substrate 10 having a conformal layer 24, substrate 10 is heated in the presence of steam. This heating step involves heating substrate 10 to a temperature of at least 800° C. for at least 15 minutes and is known to one of ordinary skill in the art. The steam is preferably formed by while introducing $H_2$ and $O_2$ at a substantially high temperature to cause vaporization. This vaporization produces $H_2O$ and $OH^-$ radicals. In one embodiment, this vaporization is formed by a temperature of 850° C. By this initial step, glass layer 26 initially reflows.

Irrespective of the heating step in the presence of steam, glass layer 26 is not smooth, but can be characterized as a nonplanar, rough surface. Further, while formed superjacent the topography of substrate 10, unlike conformal layer 24, glass layer 26 creates pockets of non-material or voids, 28 and 28', underneath the region where conformal layer 24 conforms over polymer resist layers 22 and 22'. These voids 28 and 28' are not desirable and are problematic.

Figure 4:
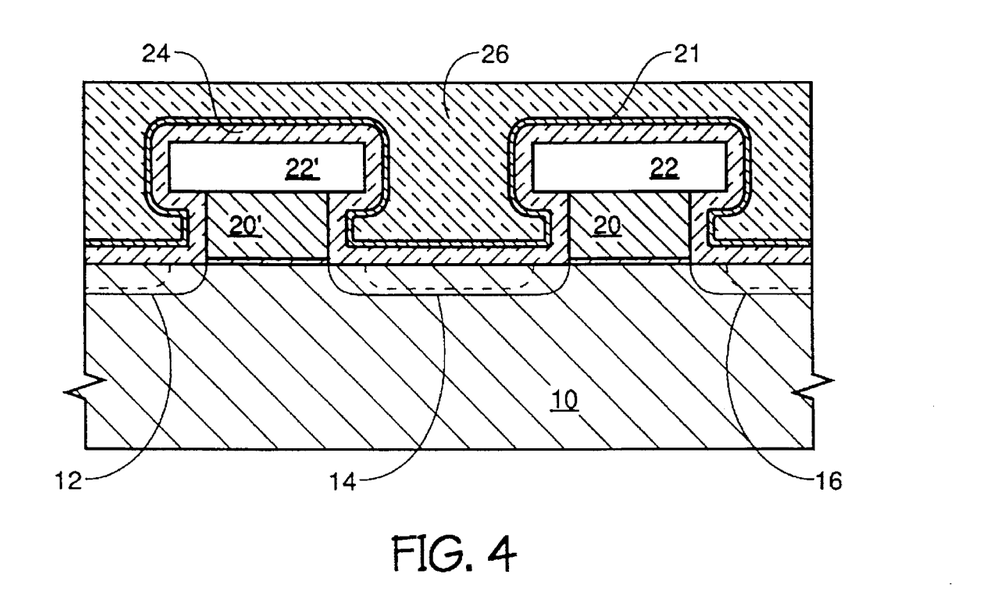
FIG. 4 is a cross-sectional perspective of a silicon substrate undergoing the third step of the present invention.

Referring to FIG. 4, a cross-sectional perspective of semiconductor substrate 10 is depicted having undergone a final step of the present invention. Once substrate 10, and thereby glass layer 26, have been heated in the presence of steam, glass layer 26 is exposed to a gas and radiant energy for the purposes of performing Rapid Thermal Processing ("RTP"). This radiant energy is generated by at least one of a rapid thermal processing source and a high density plasma source.

RTP is a method of heating through the use of radiant energy. This approach provides several advantages in processing semiconductor substrates over other more traditional heating techniques. First, RTP allows the surface of the substrate to be heated reach the required process temperature much quicker; in a matter of seconds. Further, RTP enables that substrate's surface to cool in a matter of seconds. In light of its quick heating and cooling characteristics, RTP protects the body of the substrate from reaching the process temperature. As such, RTP provides accurate control of the development of thin oxide films because of the short heating/cooling time cycle.

The gas employed in this RTP cycle step should comprise at least one of $N_2$, $NH_3$, $O_2$, $N_2O$, Ar, Ar—$H_2$, $H_2$, $GeH_4$, and a Fluorine based gas. Further, the gas should be introduced at a flow rate substantially in the range of 50 sccm to 20,000 sccm. The radiant energy should generate a temperature substantially within the range of 700° C. to 1250° C. The extent of exposing glass layer 26 to gas and radiant energy is preferably in the approximate range of 5 seconds to 60 seconds.

One intent of performing an RTP step is to cause glass layer 26 to more uniformly reflow. As a result of exposing substrate 10 and glass layer 26 to both the gas and radiant energy, glass layer 26 more uniformly reflows and voids 28 and 28' are eliminated. As such, glass layer 26 is transformed into a more planar surface, requiring minimal chemical mechanical planarization ("CMP") to planarize the surface. It is preferred that glass layer 26 (and in particular a doped glass film) is hardened with a plasma treatment using an $N_2$ containing species prior to reflow. Glass layer 26 may also be reflowed by using high pressure oxidation (HIPOX) to reduce the thermal budget and may be used in several ways. One way is to subject glass layer 26 to high pressure oxidation (using either dry oxygen alone or a wet ambient) and then subjecting glass layer 26 to an RTP step. Another way is to perform the RTP step first and then apply the high pressure oxidation step as discussed above.

A further aim in applying the RTP step is to activate implanted regions 12, 14 and 16. Thus, upon completing the RTP step, regions 12, 14 and 16 in FIG. 4 represent activated implanted regions. It should be noted that by activating regions 12, 14 and 16, a certain amount of controlled diffusion takes place to allow these regions to expand to their desired dimensions. This can be best viewed by comparing FIG. 3 with FIG. 4.

In performing this RTP step, several additional advantages have been observed. Firstly, because a reduced thermal budget is required for reflow by using the present inventive method, dopant diffusion is substantially limited. Second, because the present invention provides for better activation of the implanted regions, the number of defects in the implanted regions are thereby reduced. Third, a lower junction depth is enabled with respect to the activated implanted regions, as the diffusion length is reduced. Fourth, the resultant device comprises a lower $v_t$ drift. As each device's $v_t$ is created by the boron and phosphorus implant in implanted regions 12, 14 and 16, this benefit is a result of the RTP cycle step's ability to reduce the boron and phosphorus movement, as well as defects in the channel.

EXPERIMENTAL RESULTS

Recently experiments on P-type silicon wafer substrate were performed to illustrate the advantages of the present inventive method. To investigate the effect of various reflow conditions from a structural standpoint, As and $BF_2$ were implanted for junction movement studies and a polysilicon step of 0.8 mm was employed for transmission electron microscopy ("TEM") and scanning electron microscopy ("SEM") analysis using a standard photolithographic patterning sequence. BPSG film deposition was carried out in an atmospheric system having a film thickness, preferably between 1 mm to 2.5 min. The BPSG deposition process was silane based with $PH_3$ and $B_2H_6$ dopant sources. Dopant concentrations of 1 to 5 wt % B, 2 to 9 wt % P were then used.

N-channel and p-channel devices were then built using a standard CMOS process flow. The transistor polysilicon length was 0.9 mm for the p-channel device and 0.7 mm for the n-channel device. The p-channel device was defined with a separate mask from the n-channel device. The p+ junction was defined by the $BF_2$ low energy implant, though the main diffusion drive was due to the steam reflow/RTP cycles.

BPSG reflow, dopant activation, and diffusion properties were studied using both steam reflow an RTP anneals. The RTP temperatures ranged from 950° C. to 1100° C. for 10 to 30 seconds, while steam reflow was performed at 850° C. for 30 minutes in $H_2$ and $O_2$ ambients followed by a short anneal in $N_2$. The furnace alone reflow step was performed at 900° C. for 30 minutes in $N_2$.

Dopant activation was measured in terms of reduction in sheet resistance after RTP. The steam reflow conditions were maintained identical through this experiment at 850° C. for 30 minutes. At least a 50 Å thin layer of TEOS was used—though other suitable layers could also be employed—between the BPSG and source-drain regions. At the reflow temperature, where both a steam reflow step and RTP cycle step were employed, no measurable diffusion of boron and phosphorus was observed in the implanted regions. Complete reflow was established at 850° C. in steam, followed by RTP cycle steps of 950° C. and higher.

Minor roughness were discovered on the BPSG surface. This coarseness can be attributed to either the incomplete furnace reflow step or RTP cycle step alone. Further, this roughness can be planarized by using subsequent planarization steps. This is especially the case where there is a need to control the diffusion length. Nonetheless, the source-drain activation was not complete and results in lower overall device speed due to higher sheet resistance.

| REFLOW & ACTIVATION TEMPERATURES | REFLOW & ACTIVATION TIME | SHEET RESISTANCE OHM/SQ |
|---|---|---|
| 850° C. STEAM + 1050° C. RTP | 30 MINUTES STEAM + 5 SECONDS RTP | 35.51 |
| 850° C. STEAM + 1000° C. RTP | 30 MINUTES STEAM + 20 SECONDS RTP | 33.80 |
| 850° C. STEAM + NO RTP | 30 MINUTES | 93.52 |
| 900° C. STEAM + NO RTP | 30 MINUTES | 75.45 |
| 950° C. STEAM + NO RTP | 60 MINUTES | 36.43 |
| NO STEAM + 1100° C. RTP | 20 SECONDS | 33.80 |

A data table incorporated hereinabove illustrates the sheet resistance as it corresponds to various reflow and activation cycles. As shown, the device level process steps were duplicated on short tests. Further, the BPSG, polysilicon, and barrier oxides were etched off to bare silicon to measure the sheet resistance. Thus, a tradeoff must be reached among properties of BPSG activation of the source-drain and junction movement. Very high thermal budgets are hence not a practical solution from a device standpoint. The activation data of the data table incorporated hereinabove illustrates the advantages, in terms of superior reflow and activation properties, of using a steam reflow step and an RTP cycle step in forming actual devices.

Figure 5:
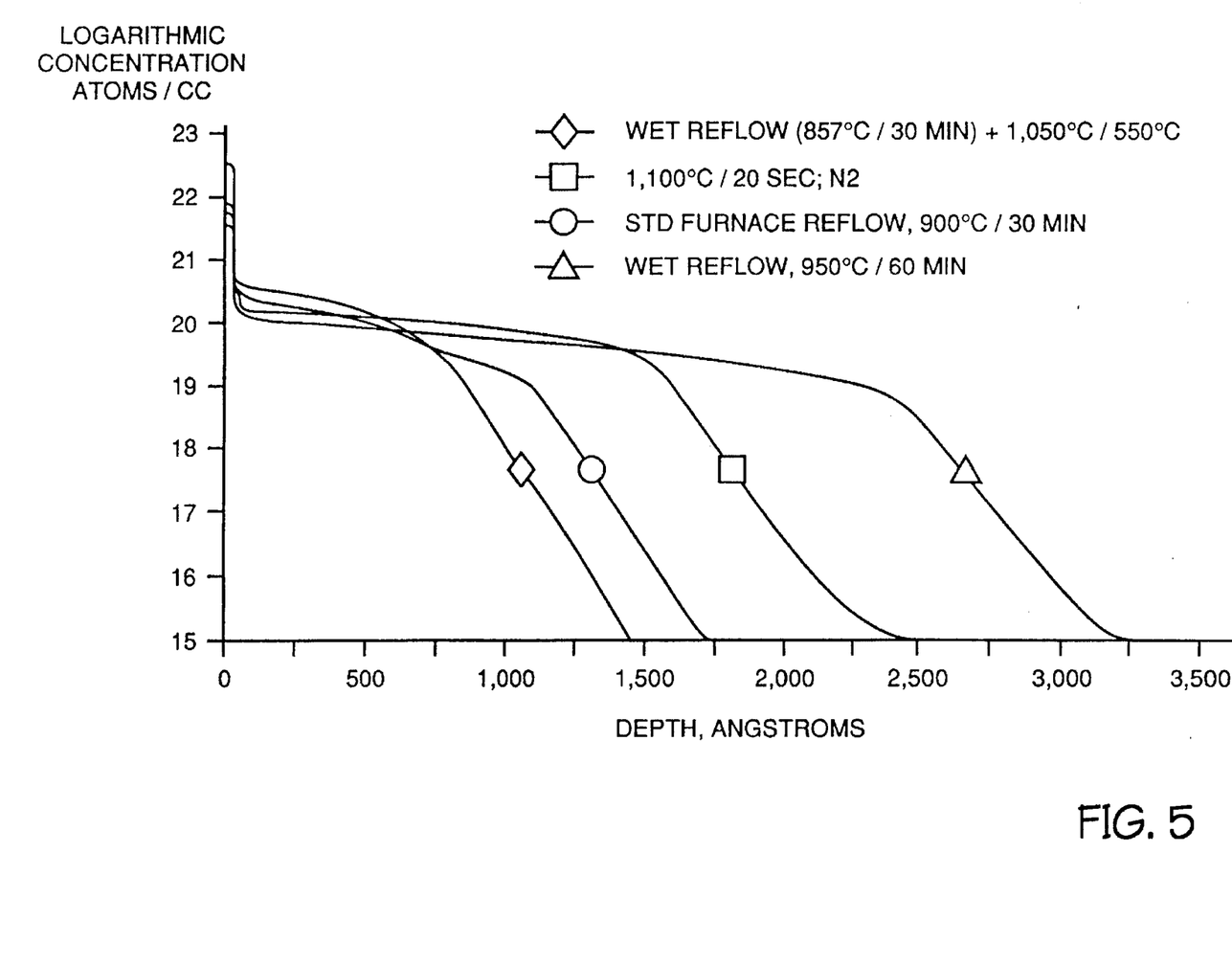
FIG. 5 is a graph illustrating Junction Depth versus Dopant Concentration.

Referring to FIG. 5, a graph comparing Dopant Log Concentration versus Junction Depth characteristics of the related art and the proposed invention is illustrated. FIG. 5 illustrates the profiles of four of the thermal conditions relied is upon in the hereinabove incorporated data table. It has been observed that junction depth reaches a minimum when a 857° C. steam reflow step was followed by a 1050° C. RTP cycle step. The $R_s$ for this combination was recorded to be 35.51 ohms/sq. Although a 900° C. furnace reflow step was performed in the experiment, the sheet resistance remained higher, on the order of 75.45 ohms/sq. This result suggests that the BPSG layer would need aggressive planarization. Although steam reflow at high temperatures and longer times (950° C. for 60 minutes) or RTP alone (1100° C. for 20 seconds) results in very low values of sheet resistance, the junctions are deeper in both these cases, as supported by the graph of FIG. 5. Therefore, a low temperature steam reflow step and short, high temperature RTP cycle steps gives a minimum junction depth compared with other approaches known in the art.

Another observation as a result of the above experiment, was that steam ambients following an RTP cycle step inhibit the formation of microcrystal defects. The resultant BPSG layer was examined and found to be amorphous and void free. The coarse and elongated grain structure of polysilicon was separated from the silicon substrate by a 200 Å thick thermal oxide layer and the region near the polysilicon gate were implanted with $BF_2$. In the case of dry furnace reflow, defects and dislocation loops were observed in the implanted areas. However, no such defects were discovered in the case of applying a steam reflow step followed by an RTP cycle step. Further, the regions between two polysilicon steps were also scrutinized. As no defects were observed, the steam reflow step and the RTP cycle step combination provided minimal damage to the junction area.

Figure 6:
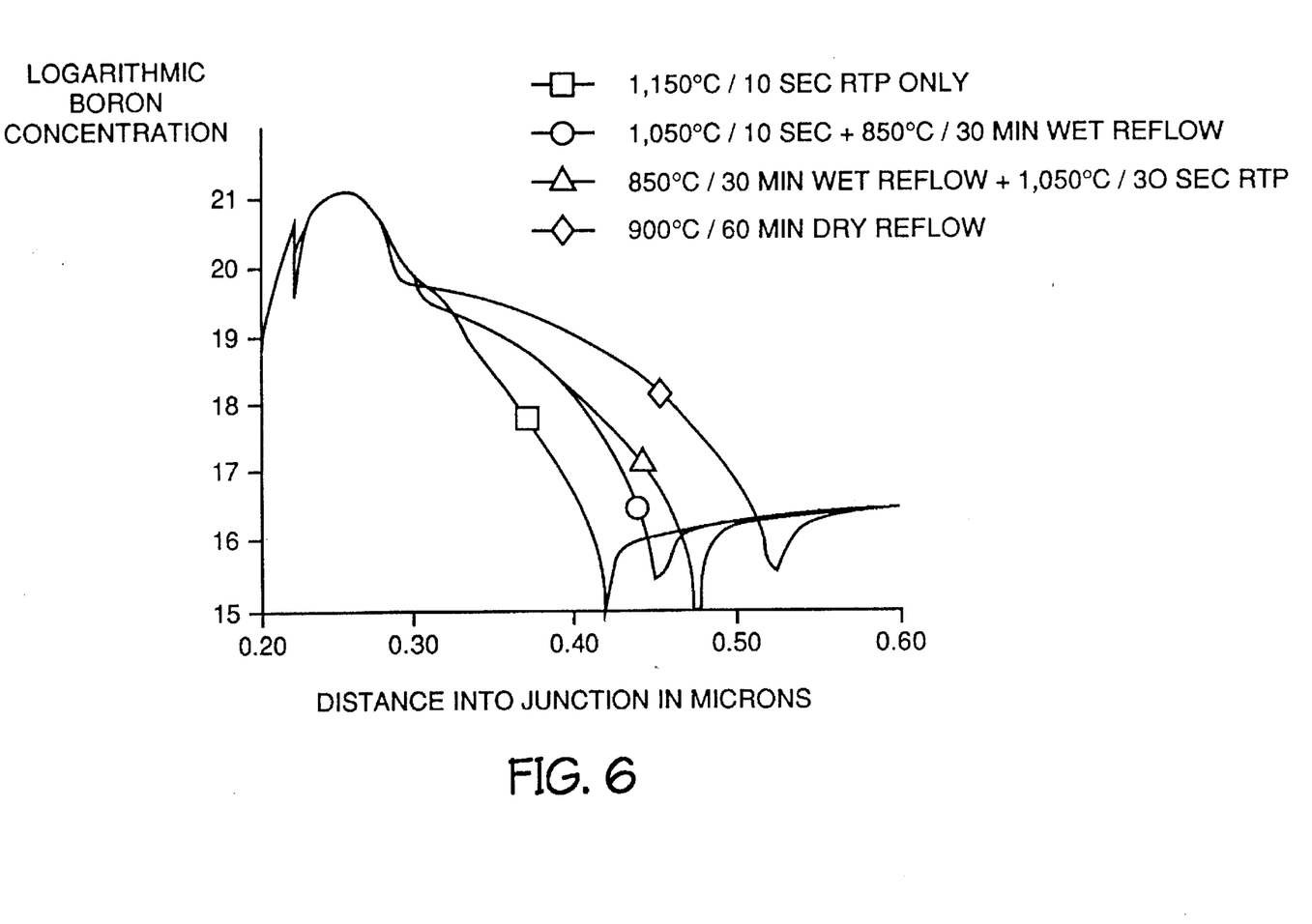
FIG. 6 is a graph illustrating Distance into Junction versus Boron Concentration.

Referring to FIG. 6, a graph comparing Boron Concentration versus Distance into Junction characteristics of the related art and the proposed invention is illustrated. The effects of RTP followed by the steam reflow cycle on the transistor devices was also noted specifically on p-channel transistors which were activated using the reflow conditions. The lower temperature in the case of steam reflow (850° C.) reduces the junction depth so that the boron lateral outdiffusion in the p+ region is reduced as shown by the SUPREM/Predict profiles of FIG. 6. The n-channel was constructed with a lightly doped drain ("LDD") structure with a boron profile for punchthrough protection.

Figure 7:
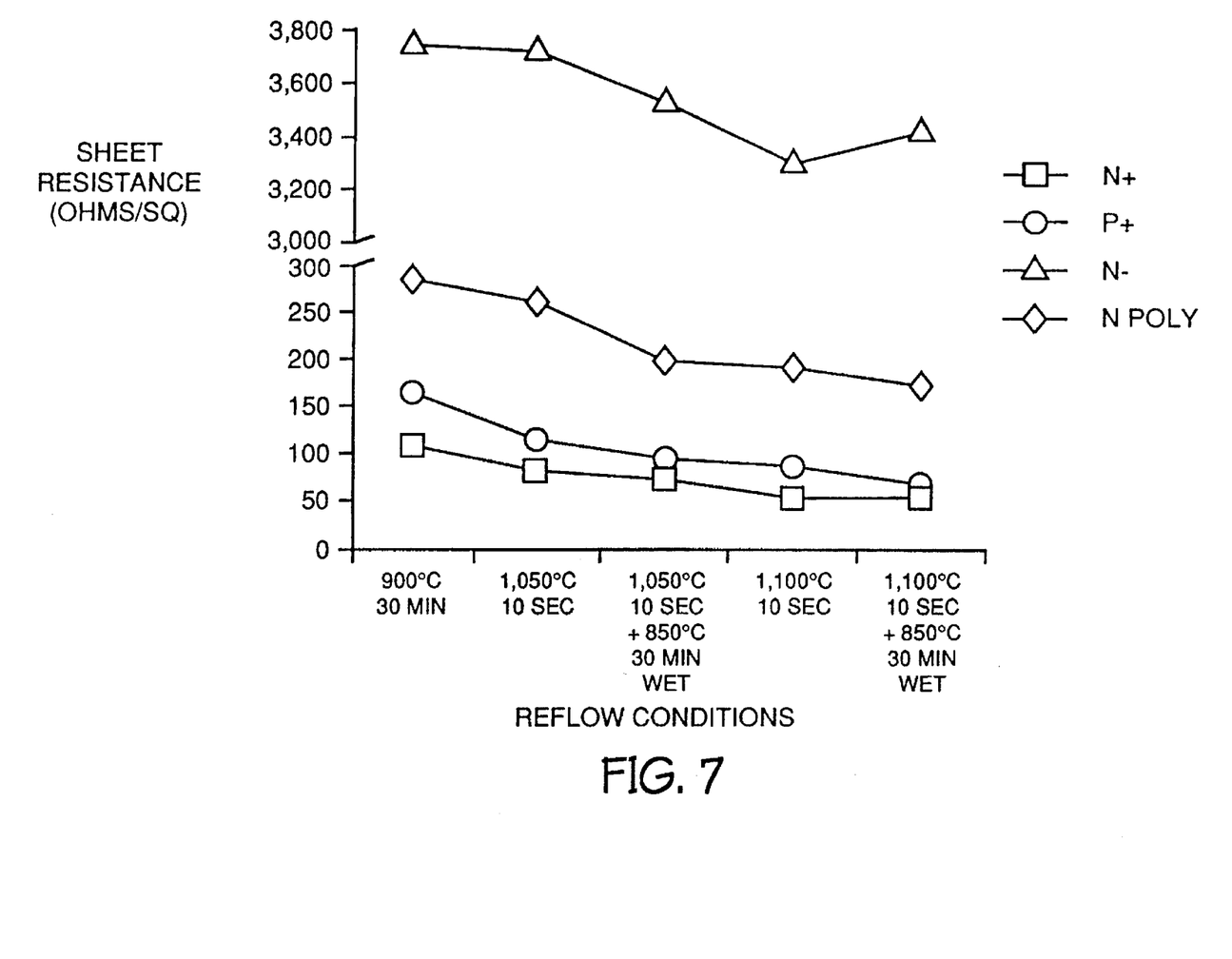
FIG. 7 is a graph illustrating Reflow Conditions versus Sheet Resistance.

Referring to FIG. 7, a graph comparing Sheet Resistance versus the Reflow Conditions characteristics of the related art and the proposed invention is illustrated. The steam reflow step followed by the RTP step also gave approximately the same p+ sheet resistance as in the case where the RTP cycle step was completed prior to steam reflow. However, the junction depth was deeper by 0.021 mm using the approach of the present invention, as best viewed by FIG. 7. This can plausibly be attributed to the incomplete annealing of the p+ junction damage when the steam reflow step is performed prior to the RTP step. It should be noted that the RTP cycle step performed without steam reflow reduces the junction depth. The steam reflow moved the junction depth by 0.037 mm compared to the RTP cycle step alone.

The sheet resistance of N+ and P+ dopants was also observed to be effected more by the surface concentration than the junction depth. FIG. 7 illustrates the results of the n−, n+, and p+ sheet resistances. The steam reflow groups decreased the sheet resistance due to added diffusion time and activation. The activation was not complete at 1050° C. compared to 1100° C. RTP cycle because the 1100° C. group shows lower sheet resistance. The lower sheet resistance can be attributed to either by the incomplete activation of the 1050° C. group or by the deeper junction of the 1100° C. group.

Figure 8:
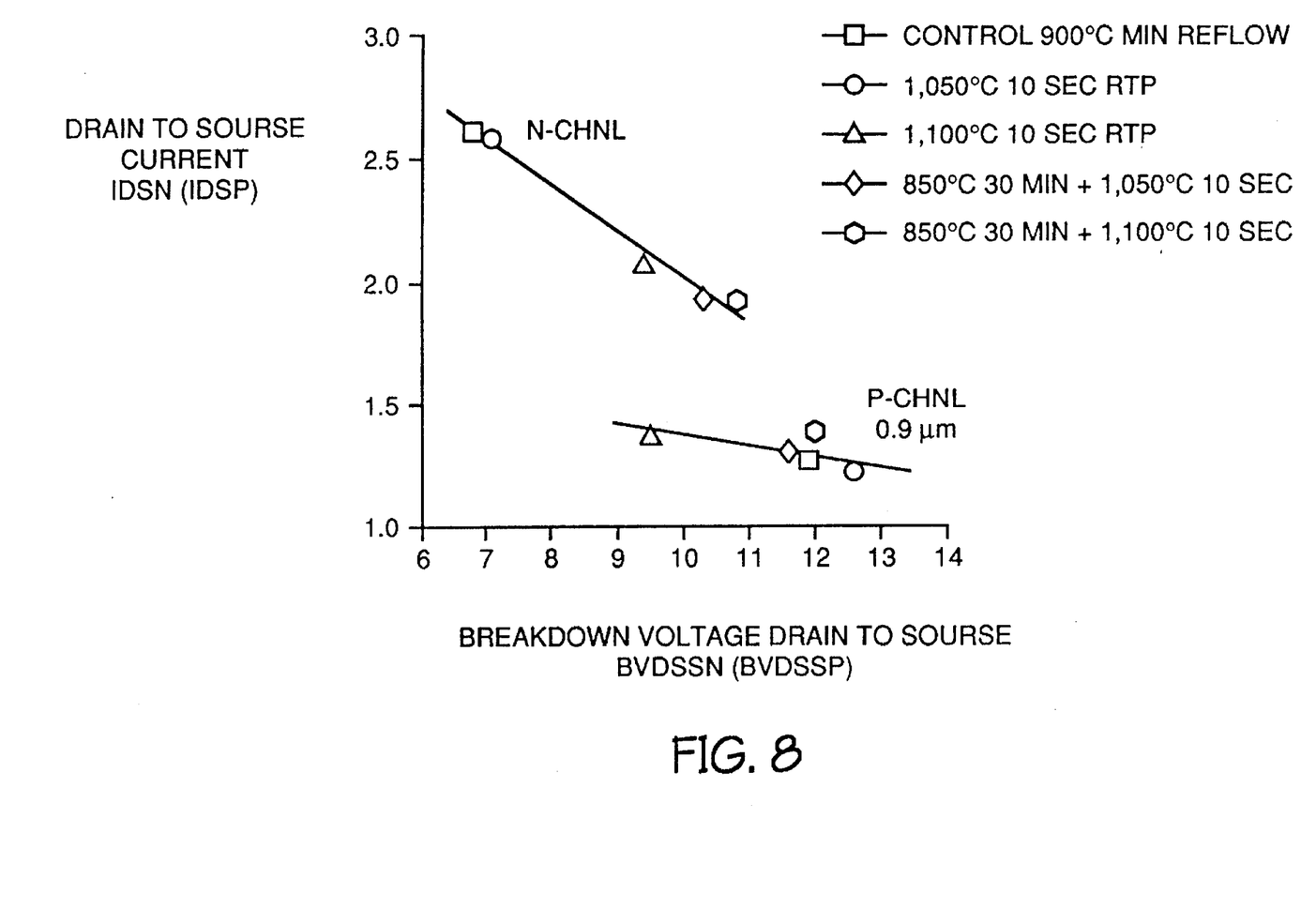
FIG. 8 is a graph illustrating Breakdown Voltage Drain to Source versus Drain to Source Current.

Referring to FIG. 8, a graph comparing Breakdown Voltage from Drain to Source versus Drain to Source Current characteristics of the related art and the proposed invention is illustrated. Transistor data indicated that for a given transistor length, for example, a length of 0.7 mm for an n-channel and 0.9 mm for a p-channel, the effective channel length, also referred to as LEFF, for the n-channel device was reduced by the RTP cycle step with or without steam reflow step. The drain-to-source transistor current (IDS) varied with the drain-to-source breakdown voltage (BVDSS), as shown in FIG. 8. The n-channel transistor had a larger reduction in the drain-to-source breakdown voltage which translates into a higher drain-to-source current (IDSN). As shown in FIG. 8, the phosphorus dopants that are in the n-LDD region under the gate became more electrically activated than the boron dopants from the punchthrough protection implant. As such, there is less damage to the lattice structure. Therefore, the electrically active phosphorus atoms compensate more boron atoms and reduce the punchthrough protection. Otherwise, both the p-channel and n-channel transistors would change similarly with respect to the BVDSS.

Furthermore, the threshold voltage ($v_t$) of the 0.8 mm p-channel device was 30 mV higher for the 1100° C. groups while the 1050° C. group had no difference from the furnace alone, 900° C. group. Similarly, the threshold voltage of the n-channel, 0.7 mm device was 56 mV lower for the 1100° C., while the 1050° C. groups were similar to the 900° C. furnace anneal control group. The threshold voltage, as such, differs more with transistor devices that have smaller channel length.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method used during fabrication of a dynamic random access memory, said method comprising the steps of:

forming a glass layer superjacent patterned structures on a semiconductor substrate, where said patterned structures have an aspect ratio of at least 1:1;

heating said glass layer in the presence of steam to a temperature of at least 800° C. for at least 15 minutes; and exposing said glass layer to a gas and radiant energy.

2. The method according to claim 1, wherein said radiant energy is generated by a rapid thermal processing (RTP) source.

3. The method according to claim 2, wherein said radiant energy generates a temperature within the range of 700° C. to 1250° C.

4. The method according to claim 2, wherein said gas comprises at least one of $N_2$, $NH_3$, $O_2$, $N_2O$, Ar, Ar—$H_2$, $H_2$, $GeH_4$, and a Fluorine based gas.

5. The method according to claim 2, wherein said glass layer is exposed to said gas at a flow rate in the range of 50 sccm to 20,000 sccm and said radiant energy for 5 seconds to 60 seconds during said exposing.

6. The method according to claim 1, wherein said aspect ratio ranges from 1:1 to 1:6.

7. The method according to claim 1, wherein said patterned structures have spacing therebetween of 0.3 micron and a pitch of 0.6 micron.

8. The method according to claim 1, wherein said glass layer is an undoped glass layer.

9. The method according to claim 1, wherein said glass layer is a doped glass layer.

10. The method according to claim 1, wherein said glass layer comprises at least one of $SiO_2$, borophosphosilicate glass, phosphosilicate glass, borosilicate glass, germanium-borophosphosilicate glass and non-doped silicate glass.

11. The method according to claim 10, wherein said glass layer is deposited by ozone-TEOS based chemistry and by using an organometallic source.

12. The method according to claim 11, wherein said organometallic source is selected from a source consisting of Triethylphosphate (TEPO), Triethylphosphite (TMPI), Trimethylphosphate (TMPO), Triethylborate (TEB), Trimethylborate (TMB), and Tetramethoxy germane (TMOG).

13. The method according to claim 1, wherein said glass layer is hardened with a plasma treatment using an $N_2$ containing species prior to said exposing said glass layer to a gas and radiant energy.

14. The method according to claim 1, wherein said glass layer is reflowed by high pressure oxidation, using a dry oxygen and subjecting said glass layer to an RTP step.

15. The method according to claim 1, wherein said glass layer is reflowed by high pressure oxidation, using a wet ambient and subjecting said glass layer to an RTP step.

16. The method according to claim 1, wherein said glass layer comprises a thickness of at least 1 kÅ.

17. The method according to claim 1, wherein said steam comprises vaporized $H_2O$ and $OH^-$ radicals.

18. The method according to claim 1, further comprising the steps of:

forming a conformal layer superjacent said patterned structures; and forming said glass layer superjacent said conformal layer.

19. The method according to claim 18, wherein said conformal layer comprises a thickness of at least 50 Å.

20. The method according to claim 18, wherein said conformal layer comprises at least one of titanium nitride, tantalum nitride, titanium oxide, tantalum oxide, silicon dioxide, silicon nitride.

21. The method according to claim 18, wherein said conformal layer is formed by the dissociation of tetraethylorthosilicate ("TEOS") and then subjected to a plasma treatment of $N_2$ containing species to harden the surface of said conformal layer.

22. The method according to claim 18, further comprising the step of:

forming a barrier layer superjacent said conformal layer prior to forming said glass layer.

23. The method according to claim 22, wherein said barrier layer comprises $Si_3N_4$.

24. The method according to claim 22, wherein said barrier layer is formed by further oxidation of said conformal layer and is followed by a subsequent densification using at least one of nitrous oxide, nitric oxide or other nitrogen containing species.

25. A method for controlling lateral diffusion of impurities into a diffusion region during fabrication of a glass layer for a semiconductor device, said method comprising the steps of:

forming said glass layer over said diffusion region;

heating said glass layer in the presence of steam to a temperature of at least 800° C. for at least 15 minutes; and exposing said glass layer to a gas and radiant energy.

26. The method according to claim 25, wherein said radiant energy is generated by a rapid thermal processing (RTP) source.

27. The method according to claim 26, wherein said radiant energy generates a temperature within the range of 700° C. to 1250° C.

28. The method according to claim 26, wherein said gas comprises at least one of $N_2$, $NH_3$, $O_2$, $N_2O$, Ar, Ar—$H_2$, $H_2$, $GeH_4$, and a Fluorine based gas.

29. The method according to claim 25, wherein said glass layer is exposed to said gas at a flow rate in the range of 50 sccm to 20,000 sccm and said radiant energy for 5 seconds to 60 seconds during said exposing.

30. The method according to claim 25, wherein said semiconductor device comprises a dynamic random access memory.

31. The method according to claim 25, further comprising patterned structures between said diffusion region and said glass layer wherein said patterned structures comprise an aspect ratio ranging from 1:1 to 1:6.

32. The method according to claim 31, wherein said patterned structures have a spacing therebetween of 0.3 micron and a pitch of 0.6 micron.

33. The method according to claim 25, wherein said glass layer comprises at least one of borophosphosilicate glass, phosphosilicate glass, borosilicate glass, and germanium-borophosphosilicate glass.

34. The method according to claim 33, wherein said glass layer is deposited by ozone-TEOS based chemistry and by using an organometallic source.

35. The method according to claim 34, wherein said organometallic source is selected from a source consisting of Triethylphosphate (TEPO), Triethylphosphite (TMPI), Trimethylphosphate (TMPO), Triethylborate (TEB), Trimethylborate (TMB), and Tetramethoxy germane (TMOG).

36. The method according to claim 25, wherein said glass layer is hardened with a plasma treatment using an $N_2$ containing species prior to said exposing said glass layer to a gas and radiant energy.

37. The method according to claim 25, wherein said glass layer is reflowed by high pressure oxidation, using a dry oxygen and subjecting said glass layer to an RTP step.

38. The method according to claim 25, wherein said glass layer is reflowed by high pressure oxidation, using a wet ambient and subjecting said glass layer to an RTP step.

39. The method according to claim 25, wherein said glass layer comprises a thickness of at least 1 kÅ.

40. The method according to claim 25, wherein said steam comprises vaporized $H_2O$ and $OH^-$ radicals.

41. The method according to claim 25, further comprising the steps of:

forming a conformal layer superjacent said patterned structures; and forming said glass layer superjacent said conformal layer.

42. The method according to claim 41, wherein said conformal layer comprises a thickness of at least 50 Å.

43. The method according to claim 41, wherein said conformal layer comprises at least one of titanium nitride, tantalum nitride, titanium oxide, tantalum oxide, silicon dioxide, silicon nitride.

44. The method according to claim 41, wherein said conformal layer is formed by the dissociation of tetraethylorthosilicate ("TEOS") and then subjected to a plasma treatment of $N_2$ containing species to harden the surface of said conformal layer.

45. The method according to claim 41, further comprising the step of:

forming a barrier layer superjacent said conformal layer prior to forming said glass layer.

46. The method according to claim 45, wherein said barrier layer comprises $Si_3N_4$.

47. The method according to claim 45, wherein said barrier layer is formed by further oxidation of said conformal layer and is followed by a subsequent densification using at least one of nitrous oxide, nitric oxide or other nitrogen containing species.

* * * * *

UNITED STATES PATENT AND TRADEMARK OFFICE
CERTIFICATE OF CORRECTION

PATENT NO. : 5,646,075
DATED : Jul 8, 1997
INVENTOR(S) : Thakur et al.

It is certified that error appears in the above-identified patent and that said Letters Patent is hereby corrected as shown below:

Column 5, line 44, please delete "min" and replace with -- mm --.
Column 6, line 47, please delete "is".

Signed and Sealed this

Twenty-eighth Day of October, 1997

Attest:

BRUCE LEHMAN

Attesting Officer

Commissioner of Patents and Trademarks